(12) United States Patent
Zhang

(10) Patent No.: US 10,804,351 B2
(45) Date of Patent: Oct. 13, 2020

(54) ORGANIC LIGHT-EMITTING DIODE DISPLAY PANEL AND DISPLAY DEVICE

(71) Applicant: SHANGHAI TIANMA AM-OLED CO., LTD., Shanghai (CN)

(72) Inventor: Peng Zhang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 89 days.

(21) Appl. No.: 16/239,558

(22) Filed: Jan. 4, 2019

(65) Prior Publication Data

US 2019/0140042 A1    May 9, 2019

(30) Foreign Application Priority Data

Sep. 21, 2018  (CN) .......................... 2018 1 1106803

(51) Int. Cl.
*H01L 27/32* (2006.01)
*H01L 51/52* (2006.01)

(52) U.S. Cl.
CPC ...... *H01L 27/3276* (2013.01); *H01L 27/3262* (2013.01); *H01L 51/5237* (2013.01)

(58) Field of Classification Search
CPC ............. H01L 27/3262; H01L 27/3276; H01L 51/5237; H01L 51/56
USPC ........................................................ 257/40
See application file for complete search history.

(56) References Cited

U.S. PATENT DOCUMENTS

2010/0102333 A1   4/2010  Choi et al.
2014/0104932 A1*  4/2014  Srinivasan ......... G11C 13/0002
                                                       365/148

FOREIGN PATENT DOCUMENTS

CN    106653818 A    5/2017
CN    107819013 A    3/2018

OTHER PUBLICATIONS

Office Action of Chinese Patent Application No. 201811106803.X dated Mar. 16, 2020.

* cited by examiner

*Primary Examiner* — Long K Tran
(74) *Attorney, Agent, or Firm* — Kilpatrick Townsend & Stockton, LLP

(57) ABSTRACT

An organic light-emitting diode (OLED) display panel and a display device are provided. An array substrate in the OLED display panel is provided with a first retaining wall surrounding a display region of the array substrate, and a second retaining wall surrounding the first retaining wall. Multiple outer electrode lines are exposed in a gap region between the first retaining wall and the second retaining wall on the array substrate. At least one of the multiple outer electrode lines is provided with at least one outer blocking portion at an edge region on at least one side of the outer electrode line, and the outer blocking portion breaks an edge line on the side of the outer electrode line in an extending direction of the outer electrode line and in contact with the outer electrode line.

18 Claims, 5 Drawing Sheets

ORGANIC LIGHT-EMITTING DIODE DISPLAY PANEL AND DISPLAY DEVICE

CROSS REFERENCE TO RELATED APPLICATION

The present application claims priority to Chinese Patent Application No. 201811106803.X, titled "ORGANIC LIGHT-EMITTING DIODE DISPLAY PANEL AND DISPLAY DEVICE", filed on Sep. 21, 2018 with the Chinese Patent Office, which is incorporated herein by reference in its entirety.

FIELD

The present disclosure relates to the field of display, and more particularly to an organic light-emitting diode (OLED) display panel and a display device.

BACKGROUND

The OLED display device is a newly developed display device in which an organic light-emitting diode is used as a light-emitting display element. In the organic light-emitting diode, an organic light-emitting material is arranged between an anode and a cathode, and the organic light-emitting material is applied with a voltage via the anode and the cathode to emit light. Since no liquid crystal panel and no conventional backlight module are required in the OLED display device, the OLED display device is light and thin. In addition, the OLED display device has lower power consumption and lower cost, and can operate in a wide temperature range, as compared with other types of display devices. Therefore, the OLED display device is more and more widely applied. However, a display panel of the existing OLED display device is easily subjected to water vapor erosion.

SUMMARY

In view of this, an OLED display panel and a display device are provided in the present disclosure, to eliminate a water vapor erosion channel formed on an edge line of an outer electrode line between a first retaining wall and a second retaining wall, so as to ensure high reliability of the OLED display panel.

In some embodiments, the OLED display panel provided in the present disclosure includes an array substrate. The array substrate is provided with a first retaining wall and a second retaining wall. The first retaining wall surrounds a display region of the array substrate. The second retaining wall surrounds the first retaining wall. Multiple outer electrode lines are exposed in a gap region between the first retaining wall and the second retaining wall on the array substrate. Each of the multiple outer electrode lines has a stack structure formed by sequentially stacking a first metal layer and a second metal layer in a light emitting direction, where a metal activity of the first metal layer is higher than a metal activity of the second metal layer. At least one of the multiple outer electrode lines is provided with at least one outer blocking portion at an edge region on at least one side of the outer electrode line. The outer blocking portion breaks an edge line on the side of the outer electrode line in an extending direction of the outer electrode line and is in contact with the outer electrode line.

The display device provided in the present disclosure includes the OLED display panel described above.

In some embodiments, with the OLED display panel and the display device provided in the present disclosure, at least one of the multiple outer electrode lines is provided with at least one outer blocking portion at an edge region on at least one side of the outer electrode line, the outer blocking portion breaks an edge line on the side of the outer electrode line in an extending direction of the outer electrode line and in contact with the outer electrode line, and a portion of the first metal layer having a high metal activity located at the edge line may be eroded and then a hollow is formed. However, since the outer blocking portion divides the edge line into separated edge lines, the hollow formed by the first metal layer at the edge line cannot form the hollow channel communicating the first retaining wall with the second retaining wall, and thus the residual organic material obtained during the subsequent process that the organic film structure is manufactured cannot communicate the first retaining wall with the second retaining wall, thereby eliminating the water vapor erosion channel formed on the edge line of the outer electrode line between the first retaining wall and the second retaining wall, and ensuring the high reliability of the OLED display panel.

BRIEF DESCRIPTION OF THE DRAWINGS

Embodiments of the present disclosure, the drawings used in the description of the embodiments are illustrated below.

DETAILED DESCRIPTION OF EMBODIMENTS

Embodiments of the present disclosure are described below in conjunction with the drawings in the embodiments of the present disclosure. Apparently, the described embodiments are only a part of the embodiments of the present disclosure, rather than all of the embodiments.

As described in the BACKGROUND, since no liquid crystal panel and no conventional backlight module are required in the OLED display device, the OLED display device is light and thin. In addition, the OLED display device has lower power consumption and lower cost, and can operate in a wide temperature range, as compared with other types of display devices. Therefore, the OLED display device is more and more widely applied. However, a display panel of the existing OLED display device is easily subjected to water vapor erosion.

In view of this, an OLED display panel and a display device are provided in the present disclosure, to eliminate a water vapor erosion channel formed on an edge line of an outer electrode line between a first retaining wall and a second retaining wall, thereby ensuring high reliability of the OLED display panel.

Figure 1:
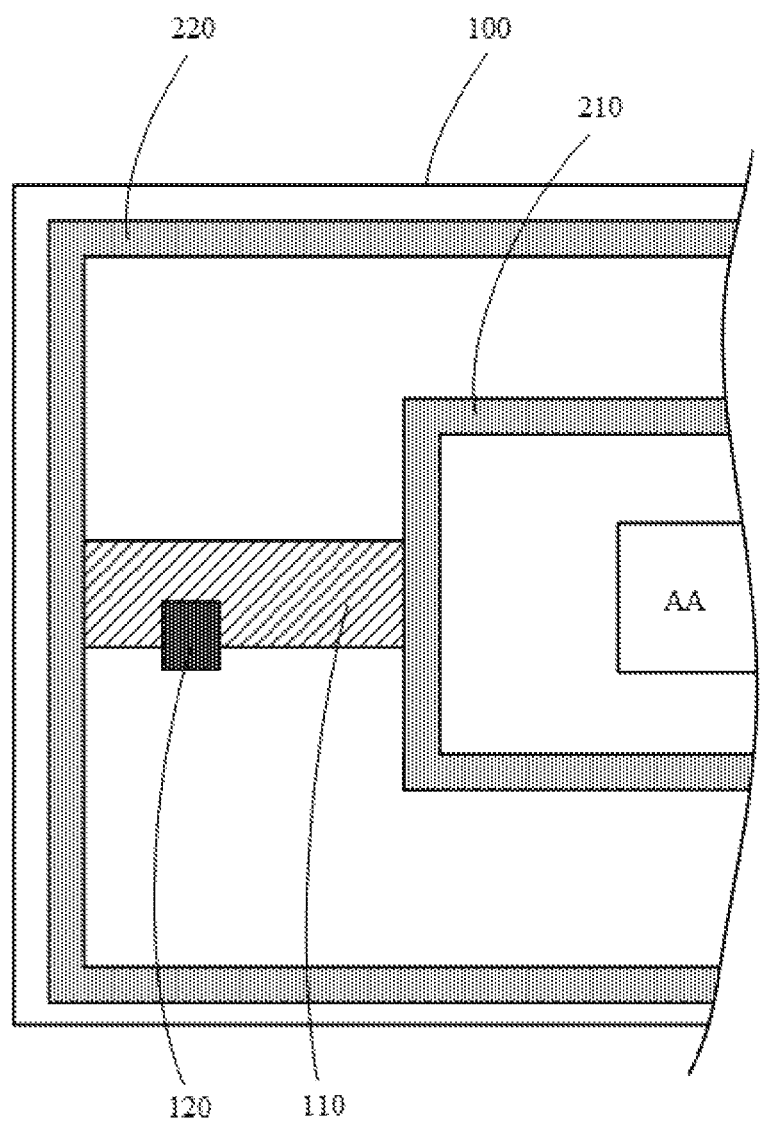
FIG. 1 is a schematic structural view of an OLED display panel according to an embodiment of the present disclosure.
Figure 2:
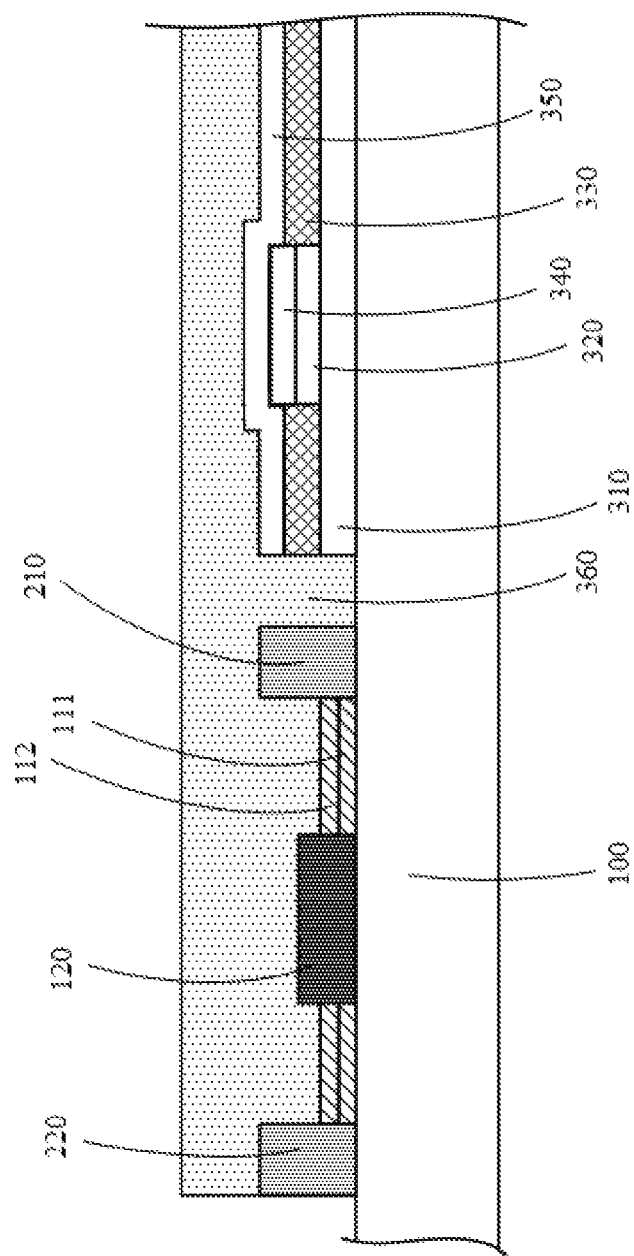
FIG. 2 is a schematic structural view of an OLED display panel according to another embodiment of the present disclosure.

Reference is made to FIG. 1 and FIG. 2. FIG. 1 is a schematic structural diagram of an OLED display panel according to an embodiment of the present disclosure. FIG. 2 is a schematic structural diagram of an OLED display panel according to another embodiment of the present disclosure. The OLED display panel includes an array substrate 100. The array substrate 100 is provided with a first retaining wall 210 and a second retaining wall 220.

The first retaining wall 210 surrounds a display region of the array substrate 100.

The second retaining wall 220 surrounds the first retaining wall 210. Multiple outer electrode lines 110 are exposed in a gap region between the first retaining wall 210 and the second retaining wall 220 on the array substrate 100. Each of the multiple outer electrode lines 110 has a stack structure formed by sequentially stacking a first metal layer 111 and a second metal layer 112 in a light emitting direction, where a metal activity of the first metal layer 111 is higher than a metal activity of the second metal layer 112.

At least one of the multiple outer electrode lines 110 is provided with at least one outer blocking portion 120 at an edge region on at least one side of the outer electrode line 110. The outer blocking portion 120 breaks an edge line on the side of the outer electrode line 110 in an extending direction of the outer electrode line 110 and is in contact with the outer electrode line 110.

The OLED display panel according to the embodiment of the present disclosure includes an array substrate. The array substrate includes a base and a transistor array located on the base. The array substrate according to the embodiment of the present disclosure is divided into a display region AA and a frame region surrounding the display region AA. The first retaining wall 210 and the second retaining wall 220 are arranged on the array substrate 100 and are located in the frame region. The OLED display panel further includes: a planarization layer 310 located on the array substrate 100, and an anode layer located on the planarization layer 310. The anode layer includes multiple anodes 320. The OLED display panel further includes a pixel definition layer 330 formed after the multiple anodes 320 are formed. The pixel definition layer 330 is provided with a hollow region corresponding to the anodes 320. The OLED display panel further includes: an organic light-emitting layer 340 located on the anodes 320, a cathode 350 on the organic light-emitting layer 340, and an encapsulation structure layer 360 for encapsulation. The encapsulation structure layer 360 according to the embodiment of the present disclosure may be a stack structure layer formed by a first inorganic film layer, an organic film layer and a second inorganic film layer.

It can be seen from the OLED display panel according to the embodiment of the present disclosure that, the planarization layer is firstly formed on the array substrate, and the first retaining wall and the second retaining wall are formed by an etching process on the planarization layer. Since the planarization layer is made of an organic material and cannot block the water vapor, the planarization layer between the first retaining wall and the second retaining wall is removed. In this case, the outer electrode line is exposed in the gap region between the first retaining wall and the second retaining wall on the array substrate. Next, the anode is formed by an acid wet etching process on the anode layer. Since the first metal layer of the outer electrode line has a higher metal activity than second metal layer, a portion of the first metal layer located at the edge line of the outer electrode line is more easily eroded by the acid liquor, and thus a hollow channel communicating the first retaining wall with the second retaining wall is formed. During a subsequent process that an organic film structure such as the pixel definition layer is manufactured, an organic material may be residual in the hollow channel. Due to the residual organic material, the first retaining wall is in communication with the second retaining wall, which results in an organic water vapor erosion channel being formed between the first retaining wall and the second retaining wall. In this case, the space between the first retaining wall and the second retaining wall cannot be completely sealed by the encapsulation structure, resulting in low reliability of the OLED display panel.

Therefore, with the OLED display panel according to the embodiment of the present disclosure, at least one of the multiple outer electrode lines is provided with at least one outer blocking portion at an edge region on at least one side of the outer electrode line, the outer blocking portion breaks an edge line on the side of the outer electrode line in an extending direction of the outer electrode line and in contact with the outer electrode line, and a portion of the first metal layer having a high metal activity located at the edge line may be eroded and then a hollow is formed. However, since the outer blocking portion divides the edge line into separated edge lines, the hollow formed by the first metal layer at the edge line cannot form the hollow channel communicating the first retaining wall with the second retaining wall, and thus the residual organic material obtained during the subsequent process that the organic film structure is manufactured cannot communicate the first retaining wall with the second retaining wall, thereby eliminating the water vapor erosion channel formed on the edge line of the outer electrode line between the first retaining wall and the second retaining wall, and ensuring the high reliability of the OLED display panel.

The transistor included in the transistor array according to the embodiment of the present disclosure may be a bottom gate transistor or a top gate transistor, which is not limited in this disclosure. In addition, in the transistor array according to the embodiment of the present disclosure, after a source drain electrode layer is formed, the planarization layer is directly formed on the array substrate without forming a passivation film layer, reducing the number of film layers to be manufactured and simplifying the manufacturing process.

In an embodiment of the present disclosure, the outer electrode line may be any electrode line such as an anode potential line, a cathode potential line, a high level line, a low level line and a clock signal line, as long as the electrode line can meet the following conditions: the electrode line is exposed at a gap region between the first retaining wall and the second retaining wall; the electrode line at least includes a first metal layer and a second metal layer; and the first metal layer having a high metal activity is easily eroded by the acid liquor. In this case, all water vapor erosion channels between the first retaining wall and the second retaining wall can be eliminated by arranging a blocking portion at an edge line of the electrode line.

Figure 3:
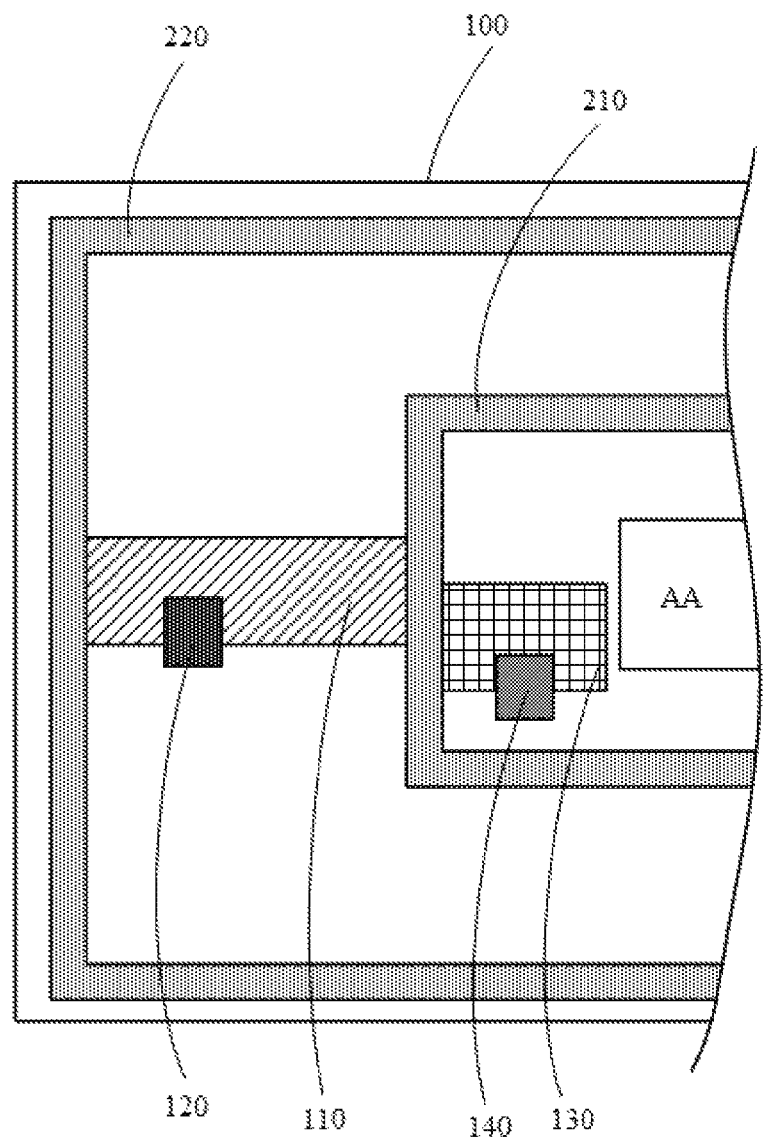
FIG. 3 is a schematic structural view of an OLED display panel according to another embodiment of the present disclosure.
Figure 4:
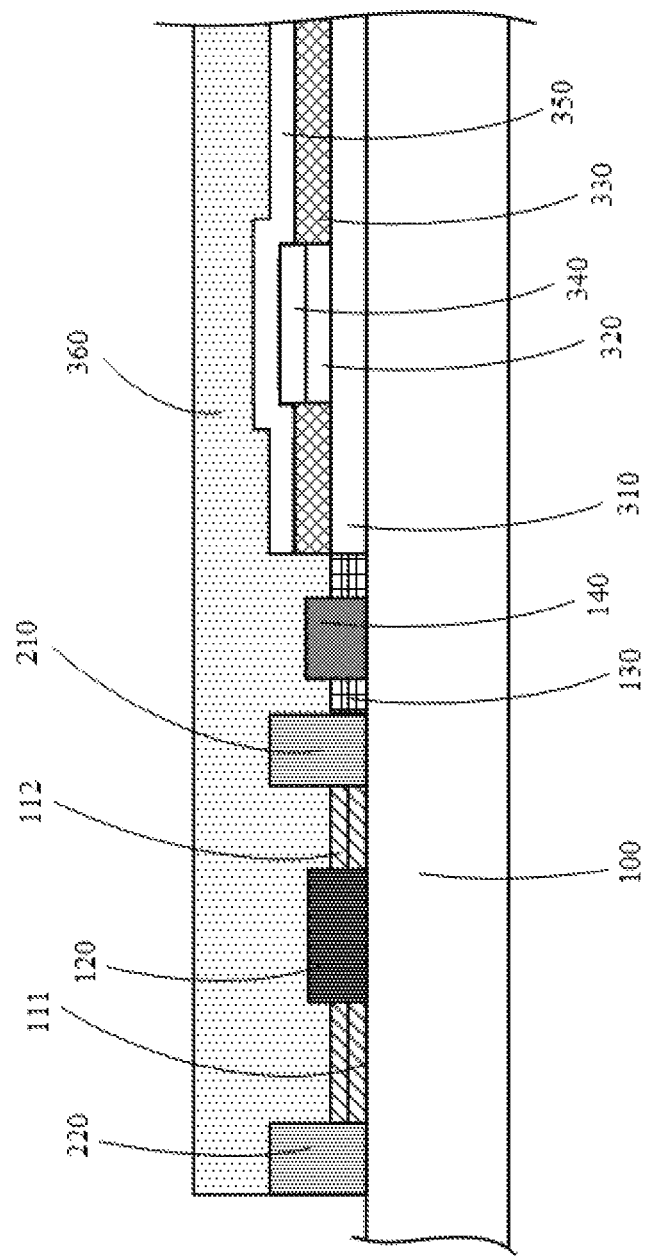
FIG. 4 is a schematic structural view of an OLED display panel according to another embodiment of the present disclosure.

Reference is made to FIG. 3 and FIG. 4, FIG. 3 is a schematic structural view of an OLED display panel according to another embodiment of the present disclosure. FIG. 4 is a schematic structural view of an OLED display panel according to another embodiment of the present disclosure. The OLED display panel includes a planarization layer 310 located in a region surrounded by the first retaining wall 210 on the array substrate 100. Multiple inner electrode lines 130 are exposed in a gap region between the planarization layer 310 and the first retaining wall 210. The multiple internal electrode lines 130 are made of a same material as the multiple outer electrode lines 110.

At least one of the multiple inner electrode lines 130 is provided with at least one inner blocking portion 140 at an edge region on at least one side of the inner electrode line 130. The inner blocking portion 140 breaks an edge line on the side of the inner electrode line 130 in an extending direction of the inner electrode line 130 and is in contact with the inner electrode line 130.

It can be understood that, in the OLED display panel according to the embodiment of the present disclosure, the inner blocking portion is arranged at the edge line of the inner electrode wire, so that the case that the first retaining wall is in communication with the planarization layer by the residual organic material can be avoided while suppressing the water vapor erosion between the first retaining wall and the second retaining wall, thereby further suppressing the water vapor erosion between the first retaining wall and the planarization layer, and ensuring the higher reliability of the OLED display panel.

It should be noted that, in the embodiment of the present disclosure, the extending direction of the outer electrode line is a direction from the second retaining wall to the first retaining wall on a side of the OLED display panel where the outer electrode line is located, and the extending direction of the inner electrode line is a direction from the first retaining wall to the planarization layer on a side of the OLED display panel where the inner electrode line is located.

Embodiments of the present disclosure are described in detail below with reference to structures of the blocking portion and the electrode line. It should be noted that the electrode line may be the outer electrode line, and the blocking portion is the outer blocking portion. In another embodiment, the electrode line may be the inner electrode line, and the blocking portion is the inner blocking portion.

In an embodiment of the present disclosure, the edge region of the outer electrode line is provided with an outer recess region recessed inwardly from a horizontal plane, and the outer blocking portion is arranged in the outer recess region; and/or the edge region of the inner electrode line is provided with an inner recess region recessed inwardly from a horizontal plane, and the inner blocking portion is arranged in the inner recess region.

The outer blocking portion divides the edge line of the outer electrode line into a concave edge line located in the outer recess region and a convex edge line located outside of the outer recess region. The concave edge line of the outer electrode line extends until a wall surface of the outer blocking portion; and/or the inner blocking portion divides the edge line of the inner electrode line into a concave edge line located in the inner recess region and a convex edge line located outside the inner recess region, and the concave edge line of the inner electrode line extends until a wall surface of the inner blocking portion.

Figure 5:
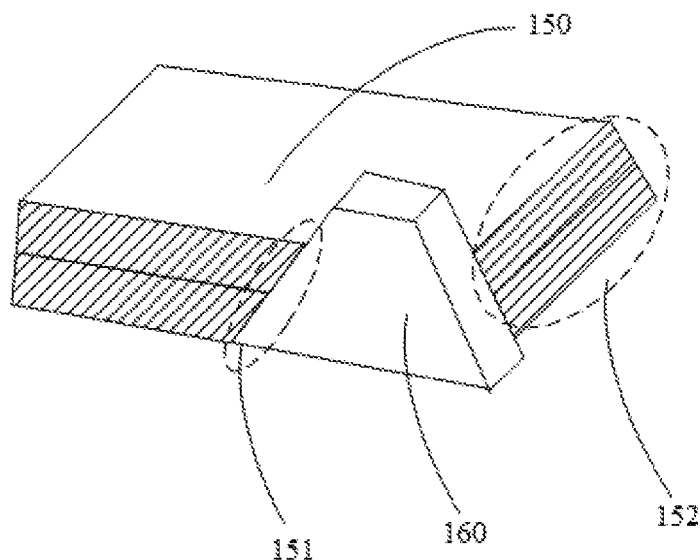
FIG. 5 is a schematic view showing structures of an electrode line and a blocking portion according to an embodiment of the present disclosure.

Reference is made to FIG. 5, which is a schematic view showing structures of an electrode line and a blocking portion according to an embodiment of the present disclosure. An edge region of an electrode line 150 is provided with a recess region recessed inwardly from a horizontal plane, and a blocking portion 160 is arranged in the recess region. In this way, the blocking portion 160 divides an edge line of the electrode line 150 into a concave edge line 151 located in the recess region and a convex edge line 152 located outside the recess region. The concave edge line 151 extends until a wall surface of the blocking portion 160. That is, during a process that the concave edge line 151 is manufactured, the process ends when the concave edge line 151 extends to the wall surface of the blocking portion 160.

As shown in FIG. 5, the electrode line provided in the embodiment of the present disclosure has a stripe structure. Therefore, the horizontal plane is a plane where the electrode line is located, and the statement "recessed inwardly" refers to being recessed towards a central region of the electrode line. In the structures of the electrode line and the blocking portion according to the embodiment of the present disclosure shown in FIG. 5, during the process that the edge line of the electrode line is eroded by the acid etching liquor, the electrode line is in contact with the blocking portion. That is, the concave edge line is in contact with the blocking portion, and a portion of the electrode line located at a sidewall of the recess region is in contact with the blocking portion. Since the electrode line has a stack structure formed by the first metal layer and the second metal layer, both the first metal layer and the second metal layer are in contact with the blocking portion in this embodiment. In this case, only a portion of the first metal layer having a large metal activity located at the convex edge line can be eroded by the acid etching liquor and then a hollow is formed, and a portion of the electrode line located at the concave edge line and at a sidewall of the recess region is protected by the blocking portion due to being in contact with the blocking portion, so that a portion of the first metal layer located in a region where the blocking portion is in contact with the electrode line cannot be eroded. In this case, a hollow channel communicating the first retaining wall with the second retaining wall and communicating the first retaining wall with the planarization layer cannot be formed, so that the organic material structure remaining in the hollow during the subsequent process that the organic film structure is manufactured is discontinuous between the first retaining wall and the second retaining wall and between the first retaining wall and the planarization layer, eliminating the water vapor erosion channel between the first retaining wall and the second retaining wall and between the first retaining wall and the planarization layer, avoiding the encapsulation failure of the array substrate, and ensuring the high reliability of the OLED display panel.

In another embodiment of the present disclosure, the edge region of the outer electrode line is provided with an outer recess region recessed inwardly from a horizontal plane, and the outer blocking portion is arranged in the outer recess region; and/or the edge region of the inner electrode line is provided with an inner recess region recessed inwardly from a horizontal plane, and the inner blocking portion is arranged in the inner recess region.

The outer blocking portion divides the edge line of the outer electrode line into a concave edge line located in the outer recess region and a convex edge line located outside the outer recess region, the concave edge line of the outer electrode line extends to a wall surface of the outer blocking portion, and the concave edge line of the outer electrode line is higher than the convex edge line of the outer electrode line; and/or the inner blocking portion divides the edge line of the inner electrode line into a concave edge line located in the inner recess region and a convex edge line located outside the inner recess region, the concave edge line of the inner electrode line extends to a wall surface of the inner blocking portion, and the concave edge line of the inner electrode line is higher than the convex edge line of the inner electrode line.

Figure 6:
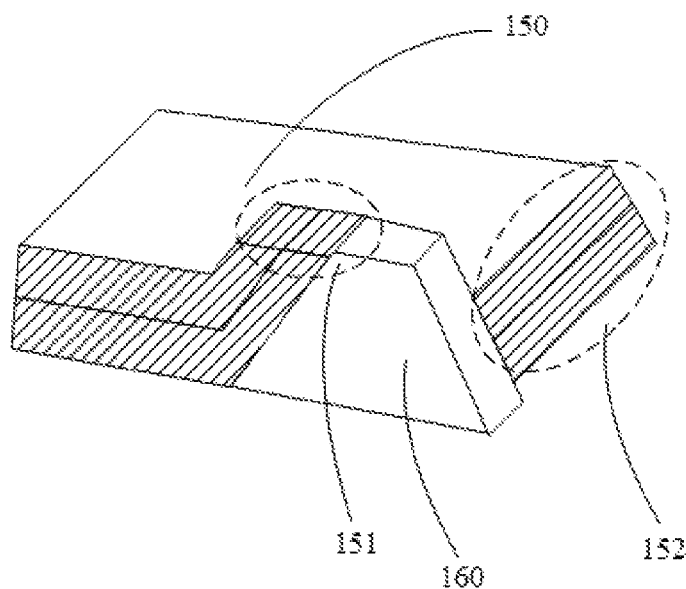
FIG. 6 is a schematic view showing structures of an electrode line and a blocking portion according to another embodiment of the present disclosure.

Reference is made to FIG. 6, which is a schematic view showing structures of an electrode line and a blocking portion according to another embodiment of the present disclosure. An edge region of an electrode line 150 is provided with a recess region recessed inwardly from a horizontal plane, and a blocking portion 160 is arranged in the recess region. In this way, the blocking portion 160 divides an edge line of the electrode line 150 into a concave edge line 151 located in the recess region and a convex edge line 152 located outside the recess region. The concave edge line 151 extends to a wall surface of the blocking portion 160 so that the concave edge line 151 is higher than the convex edge line 152, where a top surface of the blocking portion 160 facing away from the array substrate is higher than a top surface of the electrode line 150 facing away from the array substrate.

Further, the concave edge line of the outer electrode line further extends to a top surface of the outer blocking portion; and/or the concave edge line of the inner electrode line further extends to a top surface of the inner blocking portion. In this way, the blocking portion divides the concave edge line from the convex edge line well.

As shown in FIG. 6, the electrode line provided in the embodiment of the present disclosure has a stripe structure. Therefore, the horizontal plane is a plane where the electrode line is located, and the statement "recessed inwardly" refers to being recessed towards a central region of the electrode line. In the structures of the electrode line and the blocking portion according to the embodiment of the present disclosure shown in FIG. 6, during the process that the edge line of the electrode line is eroded by the acid etching liquor, the electrode line is in contact with the blocking portion. That is, a portion of the electrode line extending to a wall surface of the blocking portion is in contact with the blocking portion, and a portion of the electrode line located at a sidewall of the recess region is in contact with the blocking portion. In this case, a portion of the first metal layer having a large metal activity located at the convex edge line can be eroded by the acid etching liquor and then a hollow is formed, and a portion of the first metal layer having a large metal activity located at the concave edge line can be eroded by the acid etching liquor and then a hollow is formed. However, a portion of the electrode line located at a sidewall of the recess region is protected by the blocking portion due to being in contact with the blocking portion, so that a portion of the first metal layer located in a region where the blocking portion is in contact with the electrode line cannot be eroded, and thus the hollow formed at the concave edge line is not in contact with the hollow formed at the convex edge line. In this case, a hollow channel communicating the first retaining wall with the second retaining wall and communicating the first retaining wall with the planarization layer cannot be formed, so that the organic material structure remaining in the hollow during the subsequent process that the organic film structure is manufactured is discontinuous between the first retaining wall and the second retaining wall and between the first retaining wall and the planarization layer, eliminating the water vapor erosion channel between the first retaining wall and the second retaining wall and between the first retaining wall and the planarization layer, avoiding the encapsulation failure of the array substrate, and ensuring the high reliability of the OLED display panel.

In any one of the above embodiments in the present disclosure, at least one of the outer blocking portion and the inner blocking portion is an inorganic blocking portion. Since the first inorganic film layer is firstly formed in the process of manufacturing the encapsulation structure layer, the blocking portion is made of an inorganic material to be in contact with the first inorganic film layer well, so as to improve the encapsulation effect.

In an embodiment of the present disclosure, the outer electrode line further includes a third metal layer located on a side of the first metal layer facing away from the second metal layer. The metal activity of the first metal layer is higher than a metal activity of the third metal layer. In an embodiment of the present disclosure, the third metal layer is made of the same material as the second metal layer. The first metal layer may be made of aluminum, and both the second metal layer and the third the metal layer may be made of titanium.

In an embodiment of the present disclosure, an electrode layer forming the outer electrode line is reused as a conductive layer forming a source and a drain of the array substrate. That is, the electrode layer forming the outer electrode line is reused as a source drain electrode layer forming the source and the drain.

In addition, in any one of the above embodiments, the edge line located on each of two sides of each of the outer electrode line and the inner electrode line is covered with a protective film layer, to eliminate the water vapor erosion channel between the first retaining wall and the second retaining wall and between the first retaining wall and the planarization layer to a full extent.

A display device is further provided according to an embodiment of the present disclosure, which includes the OLED display panel described above.

With the OLED display panel and the display device according to the embodiments of the present disclosure, at least one of the multiple outer electrode lines is provided with at least one outer blocking portion at an edge region on at least one side of the outer electrode line, the outer blocking portion breaks an edge line on the side of the outer electrode line in an extending direction of the outer electrode line and in contact with the outer electrode line, and a portion of the first metal layer having a high metal activity located at the edge line may be eroded and then a hollow is formed. However, since the outer blocking portion divides the edge line into separated edge lines, the hollow formed by the first metal layer at the edge line cannot form the hollow channel communicating the first retaining wall with the second retaining wall, and thus the residual organic material obtained during the subsequent process that the organic film structure is manufactured cannot communicate the first retaining wall with the second retaining wall, thereby eliminating the water vapor erosion channel formed on the edge line of the outer electrode line between the first retaining wall and the second retaining wall, and ensuring the high reliability of the OLED display panel.

The invention claimed is:

1. An organic light-emitting diode (OLED) display panel, comprising:
    an array substrate, wherein the array substrate comprises:
        a first retaining wall surrounding a display region of the array substrate; and
        a second retaining wall surrounding the first retaining wall, wherein
        a plurality of outer electrode lines are exposed in a gap region between the first retaining wall and the second retaining wall on the array substrate, wherein each of the plurality of outer electrode lines has a stack structure formed by sequentially stacking a first metal layer and a second metal layer in a light emitting direction, and a metal activity of the first metal layer is higher than a metal activity of the second metal layer; and at least one of the plurality of outer electrode lines is provided with at least one outer blocking portion at an edge region on at least one side of the outer electrode line, and the outer blocking portion breaks an edge line on the side of the outer electrode line in an extending direction of the outer electrode line and is in contact with the outer electrode line.

2. The OLED display panel according to claim 1, further comprising:

a planarization layer located in a region surrounded by the first retaining wall on the array substrate, wherein a plurality of inner electrode lines are exposed in a gap region between the planarization layer and the first retaining wall, the plurality of internal electrode lines is made of a same material as the plurality of outer electrode lines; and at least one of the plurality of inner electrode lines is provided with at least one inner blocking portion at an edge region on at least one side of the inner electrode line, and the inner blocking portion breaks an edge line on the side of the inner electrode line in an extending direction of the inner electrode line and is in contact with the inner electrode line.

3. The OLED display panel according to claim 2, wherein the edge region of the outer electrode line is provided with an outer recess region recessed inwardly from a horizontal plane, and the outer blocking portion is arranged in the outer recess region.

4. The OLED display panel according to claim 2, wherein the edge region of the inner electrode line is provided with an inner recess region recessed inwardly from a horizontal plane, and the inner blocking portion is arranged in the inner recess region.

5. The OLED display panel according to claim 2, wherein the edge region of the outer electrode line is provided with an outer recess region recessed inwardly from a horizontal plane, and the outer blocking portion is arranged in the outer recess region; and the edge region of the inner electrode line is provided with an inner recess region recessed inwardly from a horizontal plane, and the inner blocking portion is arranged in the inner recess region.

6. The OLED display panel according to claim 3, wherein the outer blocking portion divides the edge line of the outer electrode line into a concave edge line located in the outer recess region and a convex edge line located outside the outer recess region, and the concave edge line of the outer electrode line extends until a wall surface of the outer blocking portion.

7. The OLED display panel according to claim 4, wherein the inner blocking portion divides the edge line of the inner electrode line into a concave edge line located in the inner recess region and a convex edge line located outside the inner recess region, and the concave edge line of the inner electrode wire extends until a wall surface of the inner blocking portion.

8. The OLED display panel according to claim 5, wherein the outer blocking portion divides the edge line of the outer electrode line into a concave edge line located in the outer recess region and a convex edge line located outside the outer recess region, and the concave edge line of the outer electrode line extends until a wall surface of the outer blocking portion; and the inner blocking portion divides the edge line of the inner electrode line into a concave edge line located in the inner recess region and a convex edge line located outside the inner recess region, and the concave edge line of the inner electrode wire extends until a wall surface of the inner blocking portion.

9. The OLED display panel according to claim 3, wherein the outer blocking portion divides the edge line of the outer electrode line into a concave edge line located in the outer recess region and a convex edge line located outside the outer recess region, the concave edge line of the outer electrode line extends to a wall surface of the outer blocking portion, and the concave edge line of the outer electrode line is higher than the convex edge line of the outer electrode line.

10. The OLED display panel according to claim 4, wherein the inner blocking portion divides the edge line of the inner electrode line into a concave edge line located in the inner recess region and a convex edge line located outside the inner recess region, the concave edge line of the inner electrode line extends to a wall surface of the inner blocking portion, and the concave edge line of the inner electrode line is higher than the convex edge line of the inner electrode line.

11. The OLED display panel according to claim 5, wherein the outer blocking portion divides the edge line of the outer electrode line into a concave edge line located in the outer recess region and a convex edge line located outside the outer recess region, the concave edge line of the outer electrode line extends to a wall surface of the outer blocking portion, and the concave edge line of the outer electrode line is higher than the convex edge line of the outer electrode line; and the inner blocking portion divides the edge line of the inner electrode line into a concave edge line located in the inner recess region and a convex edge line located outside the inner recess region, the concave edge line of the inner electrode line extends to a wall surface of the inner blocking portion, and the concave edge line of the inner electrode line is higher than the convex edge line of the inner electrode line.

12. The OLED display panel according to claim 9, wherein the concave edge line of the outer electrode line further extends to a top surface of the outer blocking portion.

13. The OLED display panel according to claim 10, wherein the concave edge line of the inner electrode line further extends to a top surface of the inner blocking portion.

14. The OLED display panel according to claim 11, wherein the concave edge line of the outer electrode line further extends to a top surface of the outer blocking portion; and the concave edge line of the inner electrode line further extends to a top surface of the inner blocking portion.

15. The OLED display panel according to claim 2, wherein at least one of the outer blocking portion and the inner blocking portion is an inorganic blocking portion.

16. The OLED display panel according to claim 1, wherein the outer electrode line further comprises a third metal layer located on a side of the first metal layer facing away from the second metal layer, and the metal activity of the first metal layer is higher than a metal activity of the third metal layer.

17. The OLED display panel according to claim 1, wherein an electrode layer forming the outer electrode line is reused as a conductive layer forming a source and a drain of the array substrate.

18. A display device, comprising:
an organic light-emitting diode (OLED) display panel, wherein the OLED display panel comprises an array substrate, the array substrate comprising:
a first retaining wall surrounding a display region of the array substrate; and
a second retaining wall surrounding the first retaining wall, wherein
a plurality of outer electrode lines are exposed in a gap region between the first retaining wall and the second retaining wall on the array substrate, wherein each of the plurality of outer electrode lines has a stack structure formed by sequentially stacking a first metal layer and a second metal layer in a light emitting direction, and a metal activity of the first metal layer is higher than a metal activity of the second metal layer; and
at least one of the plurality of outer electrode lines is provided with at least one outer blocking portion at an edge region on at least one side of the outer electrode line, and the outer blocking portion breaks an edge line on the side of the outer electrode line in an extending direction of the outer electrode line and is in contact with the outer electrode line.

* * * * *